United States Patent
Wilson et al.

(10) Patent No.: US 8,565,048 B1
(45) Date of Patent: Oct. 22, 2013

(54) UNIPOLAR CURRENT DRIVER

(75) Inventors: Ross S. Wilson, Menlo Park, CA (US); Jason P. Brenden, Woodbury, MN (US); Xuemin Yang, Edina, MN (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/472,448

(22) Filed: May 15, 2012

(51) Int. Cl.
 G11B 11/00 (2006.01)
 H01S 3/00 (2006.01)

(52) U.S. Cl.
 USPC .............. 369/13.26; 369/116; 372/38.07

(58) Field of Classification Search
 USPC ........... 369/116, 13.24, 13.26, 13.32; 360/59; 315/291, 224; 372/38.02, 38, 29.01, 372/29.015, 38.07
 See application file for complete search history.

(56) References Cited

U.S. PATENT DOCUMENTS

| | | | |
|---|---|---|---|
| 5,276,671 A * | 1/1994 | Minami et al. ............... | 369/116 |
| 6,301,068 B1 | 10/2001 | Ionescu | |
| 7,423,827 B2 | 9/2008 | Neville et al. | |
| 7,680,217 B2 | 3/2010 | Wilson et al. | |
| 7,929,240 B2 | 4/2011 | Mathew et al. | |
| 2005/0243879 A1* | 11/2005 | Horiuchi et al. .......... | 372/38.07 |
| 2007/0114951 A1* | 5/2007 | Tsen et al. .................. | 315/291 |
| 2009/0110015 A1* | 4/2009 | Heink et al. ............... | 372/38.02 |
| 2011/0084734 A1* | 4/2011 | Russell et al. ............. | 327/108 |
| 2011/0242691 A1 | 10/2011 | Burger | |

OTHER PUBLICATIONS

Scholz et al., "Micromagnetic Modeling of Head Field Rise Time for High Data-Rate Recording", IEEE Transactions on Magnetics, vol. 41, Issue 2, pp. 702-706 (Feb. 2005).
Taratorin et al., "Media saturation and overwrite in perpendicular recording", IEEE Transactions on Magnetics, vol. 42, Issue 2, pp. 157 Œ 162 (2006).
U.S. Appl. No. 13/362,466, Unpublised, filed Jan. 31, 2012, Nayak Ratnakar Aravind.
U.S. Appl. No. 13/302,169, Unpublished, filed Nov. 22, 2011, Boris Livshitz.
U.S. Appl. No. 13/113,210, Unpublished, filed May 23, 2011, Xun Zhang.
U.S. Appl. No. 13/100,063, Unpublished, filed May 3, 2011, Ming Jin.
U.S. Appl. No. 13/096,900, Unpublished, filed Apr. 28, 2011, Ross S. Wilson.

* cited by examiner

*Primary Examiner* — Thang Tran
(74) *Attorney, Agent, or Firm* — Hamilton DeSanctis & Cha

(57) ABSTRACT

Various embodiments of the present invention provide single-ended and differential current drivers for heat assisted magnetic recording and other applications. For example, a current driver is disclosed that includes an upper output terminal and lower output terminal, a number of current switches operable to selectively contribute electrical currents through the upper and lower output terminals, a control input for each of the current switches operable to control the electrical currents, and a voltage supply operable to establish a voltage across the upper and output terminals.

20 Claims, 4 Drawing Sheets

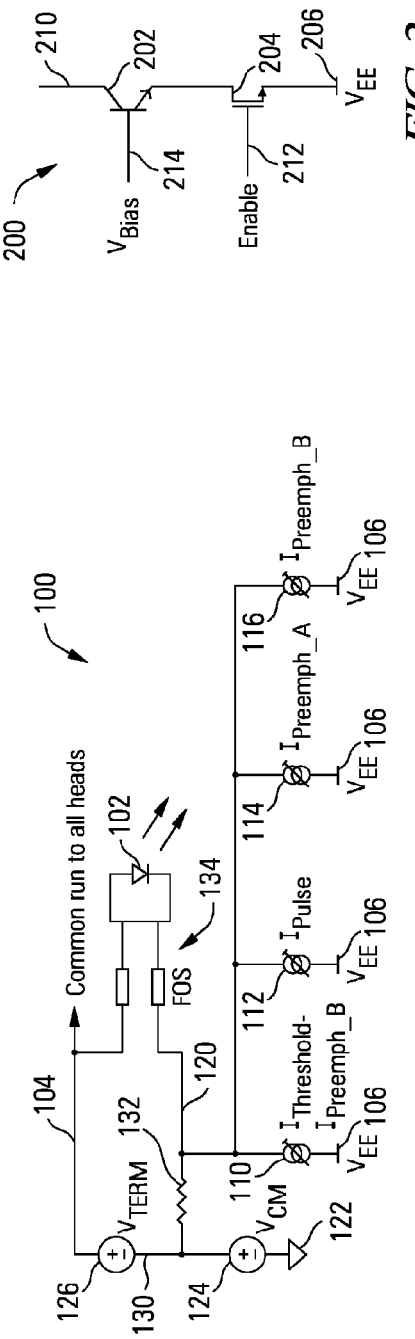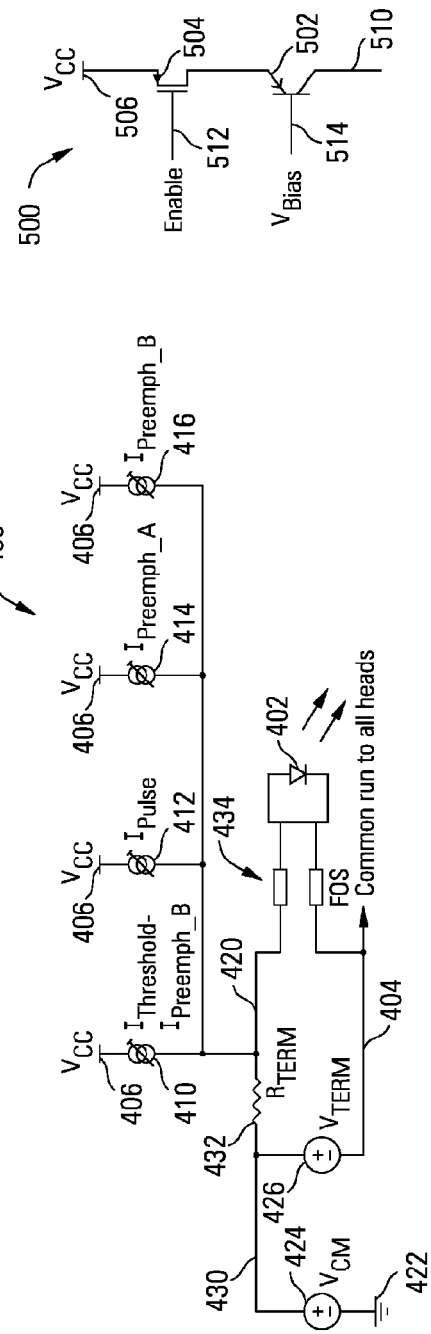

UNIPOLAR CURRENT DRIVER

BACKGROUND

Various magnetic storage systems such as hard disk drives utilize a write head to record data on a magnetic medium. Data to be recorded is provided to the write head as an alternating electrical current. The electrical current passes through a metallic coil in the write head, generating a magnetic field. The magnetization state of a pole tip in the write head is switched by the magnetic field. As the magnetized pole tip is passed over the magnetic medium, for example a spinning disc having a ferromagnetic plating, the magnetization of regions of the magnetic medium adjacent the pole tip is altered and can later be read back to retrieve the data.

High density magnetic recording implies small grain size with its increased susceptibility to decay of fine-grained recorded information under thermal agitation. Thus, as the grain size is reduced to increase recording density, stability of the recorded information is also reduced. Increasing the ferromagnetic anisotropy of the recording medium reduces susceptibility to thermally-induced decay, but requires write fields in excess of those attainable with conventional write heads. One solution to the writeability versus longevity dilemma for magnetic storage systems is Heat Assisted Magnetic Recording (HAMR), which heats the magnetic medium in the vicinity of a written data bit to near the Curie point using a laser, allowing the write head to switch the magnetic orientation on the medium to store the data bit. Thus, a medium with greater thermal stability may be used with the limited write head field strength by spot-heating the magnetic medium as data are recorded.

There exists a need in the art for improving the laser drive circuitry employed in heat assisted magnetic recording in high density and high-bit-rate magnetic storage systems in order to ameliorate driver headroom limitations and reduce power consumption.

BRIEF SUMMARY

Various embodiments of the present inventions provide a single-ended pre-emphasis laser driver for heat assisted magnetic recording or for other applications. The single-ended pre-emphasis laser driver may be used to provide electrical current to a laser diode used to heat a magnetic recording medium to improve magnetic recording of data. In some embodiments, the single-ended pre-emphasis laser driver establishes within a laser diode four current states, a 'low' current state at a threshold current level which biases the laser diode at the lasing threshold, readying the laser for rapid transition to a 'high' state, the 'high' state at a current level which turns on the laser diode, a low-edge pre-emphasis current state with a current level below the 'low' current state and applied momentarily at high-to-low transitions, and a high-edge pre-emphasis current state with a current level above the 'high' current state and applied momentarily at low-to-high transitions. Other embodiments may provide other numbers of current states and other current levels.

In some embodiments, the single-ended pre-emphasis laser driver is referenced to one supply rail. In some instances, a unipolar single-ended pre-emphasis laser driver is based on N-type devices and is referenced to a lower supply rail, in other instances, a unipolar single-ended pre-emphasis laser driver is based on P-type devices and is referenced to an upper supply rail. In some embodiments, multiple unipolar single-ended pre-emphasis laser drivers of different polarities are used in combination in a differential mode.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present inventions may be realized by reference to the figures which are described in remaining portions of the specification.

FIG. 1 depicts a single-ended unipolar HAMR laser driver with N-type devices in accordance with some embodiments of the present inventions;

FIG. 2 depicts a current switch with N-type devices that may be used in some embodiments of a unipolar HAMR laser driver in accordance with some embodiments of the present inventions;

FIG. 4 depicts a single-ended unipolar HAMR laser driver with P-type devices in accordance with some embodiments of the present inventions;

FIG. 5 depicts a current switch with P-type devices that may be used in some embodiments of a unipolar HAMR laser driver in accordance with some embodiments of the present inventions;

DETAILED DESCRIPTION OF THE INVENTION

Figure 3A:
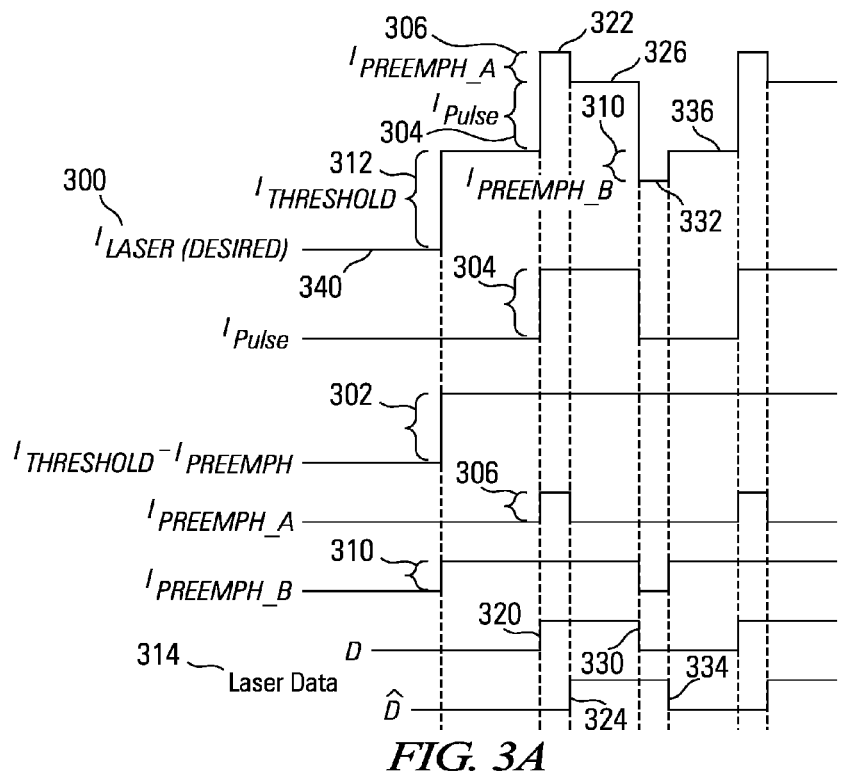
FIG. 3A depicts waveforms illustrating the operation of the single-ended unipolar HAMR laser driver of FIG. 1 with laser pulse pre-emphasis enabled in accordance with some embodiments of the present inventions.

Various embodiments of the present inventions provide single-ended and differential pre-emphasis laser drivers for heat assisted magnetic recording. The laser drivers may be used to provide electrical current to a laser diode, illuminating a magnetic recording medium and heating it to a temperature at which media grains can be efficiently switched according to the data pattern applied to a magnetic write head. Current transitions to the laser diode may be augmented with pre-emphasis, or overshoot, current pulses. Such pulses rise momentarily above the high current state on the current's low-to-high transitions; conversely, they fall momentarily below the low current state on the current's high-to-low transitions. Pre-emphasis current pulses speed up laser diode response at transitions, leading to sharper inter-bit transitions, hence lower transition noise.

In some embodiments, the single-ended or differential pre-emphasis laser drivers establish within a laser diode four current states, a 'low' current state at a threshold current level which biases the laser diode at the lasing threshold, readying the laser for rapid transition to a 'high' state, the 'high' state at a current level which turns on the laser diode, a low-edge pre-emphasis current state with a current level below the 'low' current state and applied momentarily at high-to-low transitions, and a high-edge pre-emphasis current state with a current level above the 'high' current state and applied momentarily at low-to-high transitions. Other embodiments may provide other numbers of current states and other current levels.

Both single-ended and differential pre-emphasis laser drivers are disclosed herein which are referenced to a single supply rail. The differential embodiments of the pre-emphasis laser drivers may be referenced to a single supply rail if an artificial midpoint is generated, or may be referenced to dual supply rails. Although some embodiments of the single-ended pre-emphasis laser driver generate both positive-going and negative-going pre-emphasis pulses additively from a single supply rail (in addition to a reference node such as a ground being used in the laser driver), the use of more supply rails in the laser driver is not precluded. In some embodiments, a unipolar single-ended pre-emphasis laser driver is based on N-type devices and is referenced to a lower supply rail. In some instances of these embodiments, the use of all N-type MOSFET or BJT devices provide higher carrier mobility, and thus speed and current-handling capabilities for a similarly-sized device as compared with P-type devices, in addition to simplifying control logic. In other embodiments, a unipolar single-ended pre-emphasis laser driver is based on P-type devices and is referenced to an upper supply rail. In some embodiments, multiple unipolar single-ended pre-emphasis laser drivers of different polarities are used in combination to drive a laser diode in a differential mode.

The single-ended pre-emphasis laser driver disclosed herein provides increased launch voltage capability with lower power and decreased die area as compared with double-ended drivers that are referenced to both upper and lower supply rails. The unipolar structure reduces driver headroom and allows voltage swings greater than rail voltage, for example over the upper rail for a driver referenced to the lower rail.

Turning to FIG. 1, a single-ended unipolar HAMR laser driver 100 with N-type devices is depicted in accordance with some embodiments of the present inventions. The unipolar laser driver 100 supplies current to one or more loads such as a laser diode 102. In the example embodiment of FIG. 1, multiple laser diodes can be connected in common anode fashion by a common run or node 104, with a unipolar laser driver 100 provided for each laser diode or group of laser diodes. The unipolar laser driver 100 is referenced to a single supply rail 106 to generate multiple selectable output current levels. A number of current switches 110, 112, 114 and 116 provide current in additive fashion to generate the output current levels in the laser diode 102, drawing current from the single supply rail 106. The phrase "referenced to a single supply rail" is used herein to indicate that the unipolar laser driver 100 generates multiple load current levels from a single rail 106. The current switches 110, 112, 114 and 116 are connected in parallel between the supply rail 106 and a cathode node 120 that is connected to the cathode of the laser diode 102. (The common node 104 and cathode node 120 are also referred to herein as an upper output terminal and a lower output terminal, respectively.) Each of the current switches 110, 112, 114 and 116 may be independently enabled and disabled and may be enabled one at a time or with one or more switches enabled simultaneously in different combinations to yield the desired current level at the cathode node 120 and through the laser diode 102. In some embodiments, the current switches 110, 112, 114 and 116 have programmable current output levels.

In the example embodiment of FIG. 1, the unipolar laser driver 100 is operable to produce four discrete current levels at cathode node 120 during operation, in addition to an all-off state in which all four current switches 110, 112, 114 and 116 are disabled. However, in other embodiments the current switches 110, 112, 114 and 116 can be enabled and disabled in different combinations to yield more discrete current levels. For example, the four current switches 110, 112, 114 and 116 could be operated in binary coded fashion to yield 15 discrete current levels if desired. Other embodiments may include more or fewer than the four current switches of FIG. 1.

The bias voltage with respect to a ground 122 and the voltage level across the laser diode 102 are set by voltage supplies 124 and 126, respectively. A first voltage supply 124 sets a bias voltage or common mode voltage $V_{CM}$ at a bias node 130, and a second voltage supply 126 sets a termination voltage $V_{TERM}$ that approximately offsets the $V_{ON}$ of the laser diode 102. The first voltage supply 124 is connected between the bias node 130 and ground 122, and the second voltage supply 126 is connected between the bias node 130 and common node 104. In some embodiments the $V_{CM}$ is equal to $(V_{CC}+V_{EE}+V_{HEADROOM})/2$, where $V_{EE}$ is the voltage of the lower supply rail 106, $V_{CC}$ is the voltage of an upper supply rail, and $V_{HEADROOM}$ is the headroom voltage, or the voltage needed to keep transistors in the current switches 110, 112, 114 and 116 operational in constant current mode. In an example embodiment, $V_{CC}$=5V, $V_{EE}$=-3V, $V_{HEADROOM} \approx 1V$ and $V_{TERM} \approx 1.5V$, given a laser diode such as a typical red AlGaAs laser diode exhibiting an ON voltage of about 1.5V. A termination resistor 132 is connected between the bias node 130 and the cathode node 120, enabling the unipolar laser driver 100 to support various FOS impedances by impedance matching. The $V_{TERM}$ voltage supply 126 voltage source offsets the ON voltage of laser diode 102, minimizing spurious current flow in termination resistor $R_{TERM}$ 132.

Notably, if the unipolar laser driver 100 were referenced to both upper and lower supply rails, using an upper rail to pull up the output current for positive overshoot and a lower rail to pull down the output current for negative overshoot, the overall headroom voltage would be increased, and $V_{CM}$ would be decreased by $V_{HEADROOM}/2$. The unipolar laser driver 100 thus has a higher available launch voltage over such a dual-rail-referenced driver because it avoids a second-rail current source that would erode headroom overhead.

With the unipolar laser driver 100 used to power a laser diode 102 in a magnetic recording system such as in a hard disk drive, the laser diode 102 may be mounted on an actuator arm or slider that moves to reach different regions of the recording medium. The unipolar laser driver 100 may be located in a preamplifier circuit, with the unipolar laser driver 100 connected to the laser diode 102 by a flexible conductors or flex-on-suspension (FOS) connectors 134.

Turning to FIG. 2, a current switch 200 with N-type devices is depicted that may be used in place of the current switches 110, 112, 114 and 116 in some embodiments of a unipolar HAMR laser driver. An NPN transistor 202 used to set the current level is cascoded with an NMOS transistor 204 between a supply rail 206 and a current output 210 which in this case sinks a portion of a load current. The source of the NMOS transistor 204 is connected to the supply rail 206, the drain of the NMOS transistor 204 is connected to the emitter of the NPN transistor 202, and the collector of the NPN transistor 202 is connected to the current output 210. The gate of the NMOS transistor 204 is connected to an enable signal 212, used to enable and disable the current switch 200. The NPN transistor 202 is used to set the current level through the current switch 200 by controlling the $V_{BIAS}$ voltage at the base 214 of the NPN transistor 202. This scheme has a twofold benefit. Firstly, a high-breakdown BJT 202 shields the NMOS transistor 204 from launch voltage excursions appearing at the BJT device's collector. Secondly, as the NMOS device 204, when off, effectively opens the emitter terminal of the NPN BJT 202, the BJT 2020 operates in its $BV_{CBO}$ regime, which offers highest breakdown voltage.

Each of the current switches 110, 112, 114 and 116 in a unipolar laser driver 100 may have the same or different architectures and speeds. For example, in the unipolar laser driver 100 of FIG. 1, one or more of the current switches 110, 112, 114 and 116 may use a relatively slow mirror-like source to provide a stable base current that is not changed as a sequence of data is written, while others of the current switches 110, 112, 114 and 116 use faster circuits such as local digital-to-analog converters (DACs) to rapidly change the current through the laser diode 102 to selectively heat the recording medium as data bits are written. Thus, the NPN transistor 202 may form the output transistor of a current mirror for a relatively slow mirror-like current source (e.g., to generate the basis of an $I_{THRESHOLD}$ current in current switch 110), and faster DAC circuits may be used to set the base voltage of the NPN transistor 202 to provide the varying current pulses with pre-emphasis as data bits are written in other current switches (e.g., to generate $I_{PULSE}$ in current switch 112, $I_{PREEMPH\_A}$ in current switch 114 and $I_{PREEMPH\_B}$ in current switch 116).

Figure 3B:
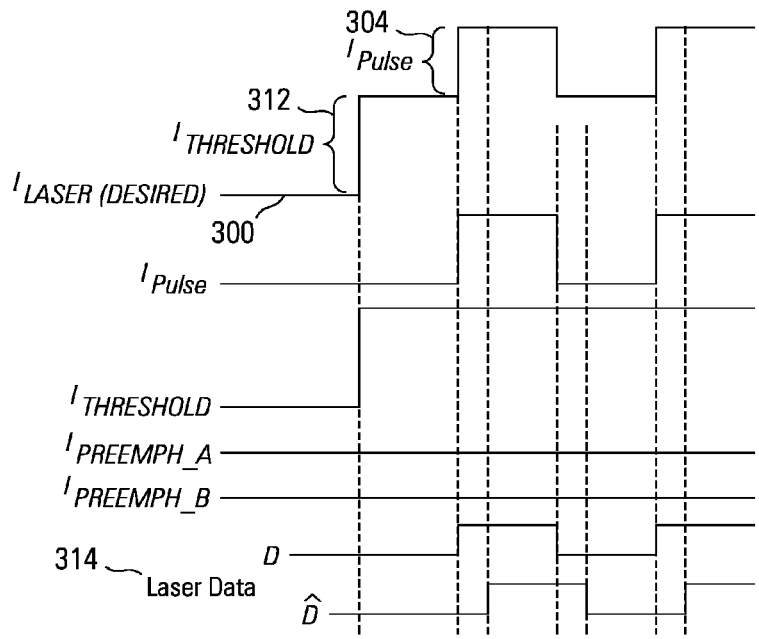
FIG. 3B depicts waveforms illustrating the operation of the single-ended unipolar HAMR laser driver of FIG. 1 with laser pulse pre-emphasis disabled in accordance with some embodiments of the present inventions.

Turning to FIGS. 3A and 3B, examples of current waveforms are depicted that may be generated in a unipolar laser driver 100 such as that of FIG. 1, both with pre-emphasis enabled (FIG. 3A) and disabled (FIG. 3B). The desired waveform for the $I_{LASER}$ current 300 through the laser diode 102 at various phases of operation is illustrated, along with the component currents from current switches 110, 112, 114 and 116 that additively produce current $I_{LASER}$ 300. A current 302 equal to $I_{THRESHOLD}-I_{PREEMPH\_B}$ is generated by current switch 110, using a relatively slow mirror-like current source, where $I_{THRESHOLD}$ is the current level 312 that brings laser diode 102 to a lasing threshold so that it can rapidly be turned on. The $I_{PULSE}$ current 304 is generated by current switch 112 using a DAC-controlled current source. The $I_{PREEMPH\_A}$ current 306 is generated by current switch 114 using a DAC-controlled current source. The $I_{PREEMPH\_B}$ current 310 is generated by current switch 116 using a DAC-controlled current source.

Current pulses are generated using current switches 112, 114 and 116 to rapidly turn the laser diode 102 on and off as data bits are recorded on the magnetic medium. A differential laser data signal 314 is used to modulate the current pulses through the laser diode 102 in conjunction with magnetic data pulses that record data bits on the magnetic medium.

The laser diode 102 is brought to the lasing threshold during operation to prepare it to be rapidly turned on when the differential laser data signal 314 is asserted. This is accomplished by enabling current switches 110 and 116 and disabling current switches 112 and 114, such that the ($I_{THRESHOLD}-I_{PREEMPH\_B}$) current 302 from current switch 110 is added to $I_{PREEMPH\_B}$ current 310 from current switch 116, yielding the $I_{THRESHOLD}$ current 312 through laser diode 102 and bringing it to the lasing threshold. Laser data 314 comprises two components: signal D; and a signal D̂, obtained by delaying signal D by a time equal to the desired duration of pre-emphasis pulses.

Upon a rising transition 320 of the differential laser data signal 314, the current switch 112 is enabled to add the $I_{PULSE}$ current 304 to the output current through the laser diode 102, as well as the current switch 114 to add the $I_{PREEMPH\_A}$ current 306 to add a pre-emphasis pulse 322 or overshoot pulse. When the differential laser data signal 314 is off in the high state, in other words after rising transitions 320 and 324 in both ends of differential laser data signal 314, the current switch 114 is disabled to turn off the $I_{PREEMPH\_A}$ current 306, ending the pre-emphasis pulse 322 and leaving the $I_{LASER}$ current 300 in the on state 326 at the $I_{PULSE}$ current level 304 above the $I_{THRESHOLD}$ current level 312.

Upon a falling transition 330 of the differential laser data signal 314, the current switch 112 is disabled to turn off the $I_{PULSE}$ current 304, as well as the current switch 116 to subtract or omit the $I_{PREEMPH\_B}$ current 310 to yield a low pre-emphasis pulse 332 or negative overshoot pulse that is below the $I_{THRESHOLD}$ current 312. When the differential laser data signal 314 is off in the low state, in other words after falling transitions 330 and 334 in both ends of differential laser data signal 314, the current switch 116 is again enabled to turn on the $I_{PREEMPH\_B}$ current 310, ending the low pre-emphasis pulse 332 and leaving the $I_{LASER}$ current 300 in the off state 336 at the $I_{THRESHOLD}$ current level 312.

To summarize, the current states produced by the unipolar laser driver 100 through the laser diode 102 include disabled 340, steady state on 326, pre-emphasis on 322, steady state off 336, and pre-emphasis off 332. The unipolar laser driver 100 is in the disabled state 340 when all the current switches 110, 112, 114 and 116 are disabled and off. The unipolar laser driver 100 is at steady state on 326 when current switches 110, 112 and 116 are enabled and current switch 114 is disabled, yielding ($I_{THRESHOLD}-I_{PREEMPH\_B}$) current 302 plus $I_{PULSE}$ current 304 plus $I_{PREEMPH\_B}$ current 310, or $I_{THRESHOLD}$ current level 312 plus $I_{PULSE}$ current 304 through the laser diode 102. The unipolar laser driver 100 is at pre-emphasis on 322 when current switches 110, 112, 114 and 116 are all on, yielding ($I_{THRESHOLD}-I_{PREEMPH\_B}$) current 302 plus $I_{PULSE}$ current 304 plus the $I_{PREEMPH\_A}$ current 306 plus $I_{PREEMPH\_B}$ current 310, Or $I_{THRESHOLD}$ current level 312 plus $I_{PULSE}$ current 304 plus $I_{PREEMPH\_A}$ current 306 through the laser diode 102. The unipolar laser driver 100 is at steady state off 336 when current switches 110 and 116 are enabled and current switches 112 and 114 are disabled, yielding ($I_{THRESHOLD}-I_{PREEMPH\_B}$) current 302 plus $I_{PREEMPH\_B}$ current 310, or $I_{THRESHOLD}$ current level 312 through the laser diode 102. The unipolar laser driver 100 is at pre-emphasis off 332 when current switch 110 is enabled and current switches 112, 114 and 116 are disabled, yielding ($I_{THRESHOLD}-I_{PREEMPH\_B}$) current 302 through the laser diode 102.

Example current waveforms in the unipolar laser driver 100 with pre-emphasis pulses disabled are illustrated in FIG. 3B. The $I_{THRESHOLD}$ current level 312 may be produced by current switch 110 without the additive pre-emphasis $I_{PREEMPH\_B}$ current 310 from current switch 116 by programming the current switch 110 to provide the entire $I_{THRESHOLD}$ current level 312. In that case, as illustrated in FIG. 3B, current switches 114 and 116 remain disabled, current switch 110 raises the laser diode 102 to the lasing threshold with $I_{THRESHOLD}$ current level 312 and current switch 112 is modulated by differential laser data signal 314 to turn the additive $I_{PULSE}$ current 304 on and off. Alternatively, the current switch 110 may continue to produce the ($I_{THRESHOLD}-I_{PREEMPH\_B}$) current level 302 with the current switch 116 constantly enabled to add the $I_{PREEMPH\_B}$ current 310. Although not depicted, it will be apparent that the disclosed laser driver is capable of operation in a static mode, wherein a current $I_{THRESHOLD}+I_{PULSE}$ is delivered continuously to the laser. Such mode may be of utility in an HAMR drive to perform dc erasure of a track. The unipolar laser driver may generate the illustrated current waveforms using other circuit topologies than the examples disclosed herein.

Turning to FIG. 4, a single-ended unipolar HAMR laser driver 400 with P-type devices is depicted in accordance with some embodiments of the present inventions. Operation is analogous, with appropriate polarity inversions, to that of the N-polarity circuit of FIG. 1. The unipolar laser driver 400 may be used in common-cathode laser configurations in which a common node 404 can connect to the cathodes of multiple laser diodes (e.g., 402), with a unipolar laser driver 400 provided for each laser diode 402 or group of laser diodes. The unipolar laser driver 400 with P-type devices is referenced to a single supply rail, in this case the upper supply rail 406. Current switches 410, 412, 414 and 416 produce the ($I_{THRESHOLD}-I_{PREEMPH\_B}$) current, $I_{PULSE}$ current, $I_{PREEMPH\_A}$ current and $I_{PREEMPH\_B}$ current, respectively, to additively generate the same current waveforms as illustrated in FIG. 3A at anode node 420 and through the laser diode 402.

The bias voltage with respect to a ground 422 and the voltage level across the laser diode 402 are set by voltage supplies 424 and 126, respectively. A first voltage supply 424 sets a bias voltage or common mode voltage $V_{CM}$ at a bias node 430, and a second voltage supply 426 sets a termination voltage $V_{TERM}$ that approximately offsets the $V_{ON}$ of the laser diode 402. The first voltage supply 424 is connected between the bias node 430 and ground 422, and the second voltage supply 426 is connected between the bias node 430 and common node 404. In some embodiments the $V_{CM}$ is equal to $(V_{CC}+V_{EE}-V_{HEADROOM})/2$, where $V_{CC}$ is the voltage of the upper supply rail 406, $V_{EE}$ is the voltage of a lower supply rail, and $V_{HEADROOM}$ is the headroom voltage, or the voltage needed to keep transistors in the current switches 410, 412, 414 and 416 in saturation. In an example embodiment, $V_{CC}$=5V, $V_{EE}$=−3V, $V_{HEADROOM}$≈1V and $V_{TERM}$≈1.5V.

With the unipolar laser driver 400 used to power a laser diode 402 in a magnetic recording system such as in a hard disk drive, the laser diode 402 may be mounted on an actuator arm or slider that moves to reach different regions of the recording medium. The unipolar laser driver 400 may be located in a preamplifier circuit, with the unipolar laser driver 400 connected to the laser diode 402 by a flexible circuit or flex-on-suspension (FOS) connectors 434. A termination resistor 432 is connected between the bias node 430 and the anode node 420, enabling the unipolar laser driver 400 to support various FOS impedances.

Turning to FIG. 5, a current switch 500 with P-type devices is depicted that may be used in place of the current switches 410, 412, 414 and 416 in some embodiments of a unipolar laser driver of FIG. 4. A PNP transistor 502 used to set the current level is connected in series with a PMOS transistor 504 between a supply rail 506 and a current output 510. The source of the PMOS transistor 504 is connected to the supply rail 506, the drain of the PMOS transistor 504 is connected to the emitter of the PNP transistor 502, and the collector of the PNP transistor 502 is connected to the current output 510. The gate of the PMOS transistor 504 is connected to an enable signal 512, used to enable and disable the current switch 500. The PNP transistor 502 is used to set the current level through the current switch 500 by controlling the $V_{BIAS}$ voltage at the base 514 of the PNP transistor 502.

Each of the current switches 410, 412, 414 and 416 in a unipolar laser driver 500 may have the same or different architectures and speeds. For example, in the P-type unipolar laser driver 400 of FIG. 4, one or more of the current switches 410, 412, 414 and 416 may use a relatively slow mirror-like source to provide a stable base current that is not changed as a sequence of data is written, while others of the current switches 410, 412, 414 and 416 use faster circuits such as local DACs to rapidly change the current through the laser diode 402 to selectively heat the recording medium as data bits are written. Thus, the PNP transistor 502 may form the output transistor of a current mirror for a relatively slow mirror-like current source (e.g., to generate the basis of an $I_{THRESHOLD}$ current in current switch 410), and faster DAC circuits may be used to set the base voltage of the PNP transistor 502 in other current switches (e.g., to generate $I_{PULSE}$ in current switch 512, $I_{PREEMPH\_A}$ in current switch 514 and $I_{PREEMPH\_B}$ in current switch 516).

Figure 6:
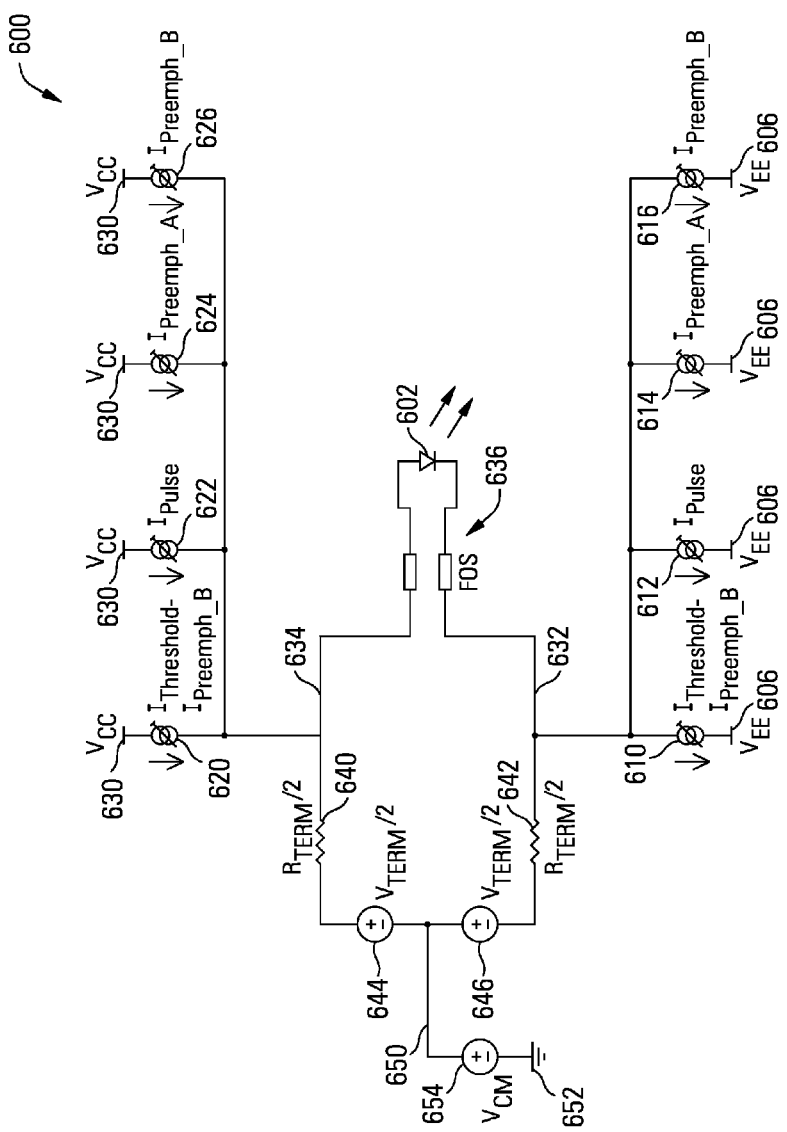
FIG. 6 depicts a differential unipolar HAMR laser driver in accordance with some embodiments of the present inventions.

Turning to FIG. 6, a pair of unipolar current drivers of opposite polarity may be combined to drive a load such as a laser diode 602 or group of laser diodes in differential mode. The differential laser driver 600 has the benefit of differentially driving the laser diode 602 via a FOS connection 636 symmetrically, eliminating common mode excitation and reducing potential crosstalk into read-head lines that share the same flex-circuit assembly. Benefits of differential mode operation include reduced electromagnetic emission, and minimal stimulation of the common-mode of the FOS transmission line. The differential laser driver 600 may be controlled by input differential control signals in any suitable manner.

The differential laser driver 600 includes N-type devices in lower current switches 610, 612, 614 and 616 referenced to a lower supply rail 606, and P-type devices in upper current switches 620, 622, 624 and 626 referenced to an upper supply rail 630. The lower current switches 610, 612, 614 and 616 additively drive a lower common node 632. The lower current switches 610, 612, 614 and 616 are thus all referenced to a single lower supply rail. The upper current switches 620, 622, 624 and 626 additively drive an upper common node 634. The upper current switches 620, 622, 624 and 626 are thus all referenced to a single upper supply rail. The laser diode 602 is connected between the lower common node 632 and the upper common node 634 via a flex-on-suspension (FOS) connection 636. The current switches 610, 612, 614, 616, 620, 622, 624 and 626 are controlled in pairs to generate waveforms such as those illustrated in FIGS. 3A and 3B, for example enabling current switches 606 and 622 simultaneously to generate the $I_{PULSE}$ (e.g., 304) portion of the load current.

Termination resistor 640 is connected in series with termination voltage supply 644 between upper common node 634 and middle common node 650. Termination resistor 642 is connected in series with termination voltage supply 646 between lower common node 632 and middle common node 650. Termination resistors 640 and 642 are matched, each providing half the termination resistance for the FOS conductors 636. Termination voltage supplies 644 and 646 are also matched, each providing half the termination voltage $V_{TERM}$ that approximately offsets the $V_{ON}$ of the laser diode 602.

The bias voltage $V_{CM}$ at the middle common node 650 with respect to a ground 652 is set by voltage supply 654, with $V_{CM}$ equal to $(V_{CC}+V_{EE})/2$, where $V_{CC}$ is the voltage of the upper supply rail 630 and $V_{EE}$ is the voltage of the lower supply rail 606.

Figure 7:
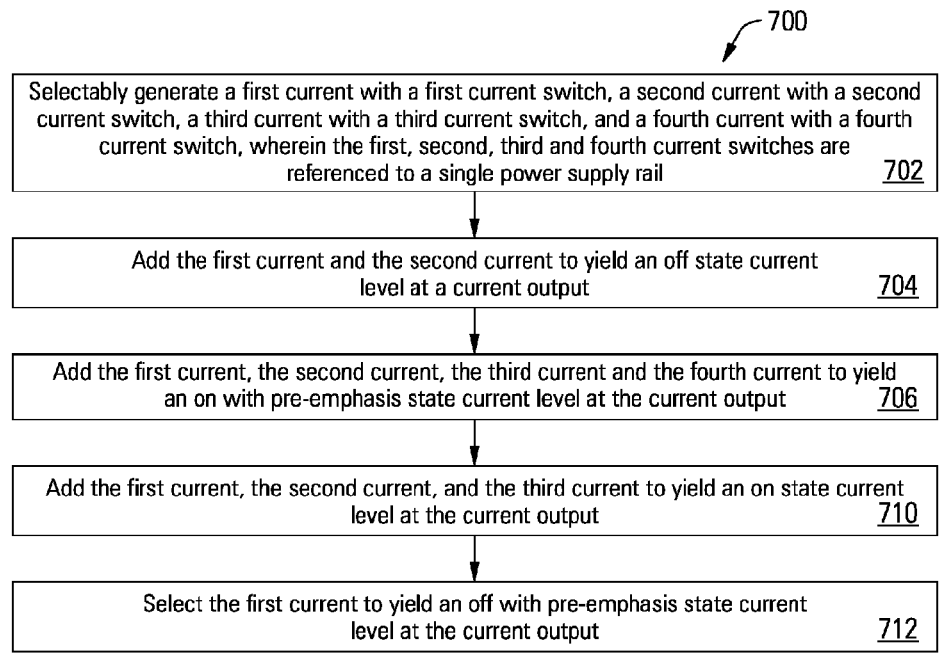
FIG. 7 depicts a flow diagram showing a method for generating multiple current levels with a unipolar current driver in accordance with some embodiments of the present inventions.

Turning to FIG. 7, a flow diagram 700 depicts an example method for generating multiple current levels with a unipolar current driver in accordance with some embodiments of the present inventions. The method of FIG. 7, or variations thereof, may be performed in unipolar laser drivers such as those illustrated in FIGS. 1-6. Following flow diagram 700, a first current is selectably generated with a first current switch, a second current is selectably generated with a second current switch, a third current is selectably generated with a third current switch, and a fourth current is selectably generated with a fourth current switch. (Block 702) The first, second, third and fourth current switches are referenced to a single power supply rail, for example to a lower rail using N-type devices as illustrated in FIG. 1, or to an upper rail using P-type devices as illustrated in FIG. 4. In some embodiments, each of the current switches may be independently enabled or disabled and output current levels selected or programmed. At various stages of operation in the unipolar current driver, the currents are combined in different ways to yield desired output current levels. The first and second currents are added to yield an off state current level at a current output. (Block 704) The first, second, third and fourth currents are added to yield an on with pre-emphasis state current level at the current output. (Block 706) The first, second and third currents are added to yield an on state current level at the current output. (Block 710) The first current is selected alone to yield an off with pre-emphasis state current level at the current output. (Block 712) The on with pre-emphasis state current level is greater than the on state current level which is greater than the off state current level which is greater than the off with pre-emphasis state current level.

Figure 8:
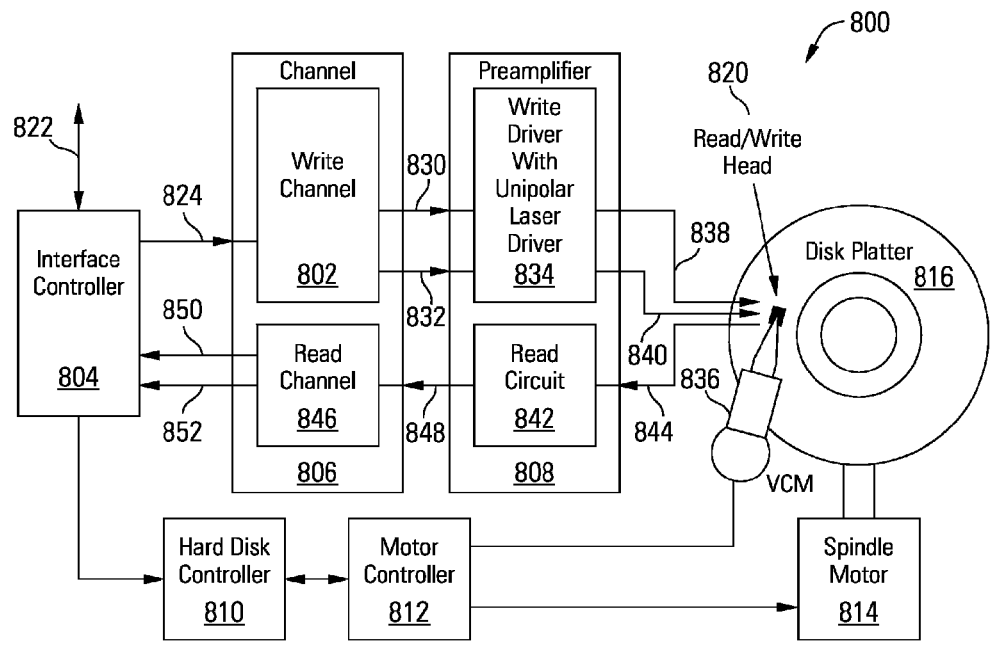
FIG. 8 depicts a magnetic storage system including a write channel using a unipolar HAMR laser driver in accordance with some embodiments of the present inventions.

Turning to FIG. 8, magnetic storage system is depicted including a write channel using a unipolar HAMR laser driver in accordance with some embodiments of the present inventions. Storage system 800 may be, for example, a hard disk drive. Storage system 800 includes an interface controller 804, channel circuit 806, preamplifier 808, a hard disk controller 810, a motor controller 812, a spindle motor 814, a disk platter 816, and a read/write head assembly 820. Interface controller 804 controls addressing and timing of data to/from disk platter 816. The interface controller 804 may include devices such as a processor, buffer memory, format control, error correction circuits, and interface circuits. The data on disk platter 816 consists of groups of magnetic signals that may be written and detected by read/write head assembly 820 when the assembly is properly positioned over disk platter 816. In one embodiment, disk platter 816 includes magnetic signals recorded in accordance with either a longitudinal or a perpendicular recording scheme. The disk platter 816 is also pre-recorded at the factory with position-location information used by the drive head positioning servo accurately to locate the read/write heads over a target track.

During a write operation, interface controller 804 receives digital data 822 to be stored on the disk platter 816 and provides corresponding digital write data 824 to the write channel 802 in the channel circuit 806. The digital data 822 may be received in serial form on a standardized device interface such as a Serial Advanced Technology Attachment (SATA) interface. During write operations, the digital data 822 is stored in a local buffer memory, formatted and augmented with error correction codes.

Write channel 802 may process the digital write data 824 in a number of ways, such as modulation coding the data and adding parity bits, serializing the data at the desired bit-rate, and performing magnetic write pre-compensation. The write channel 802 may also generate laser trigger pulses as disclosed in U.S. patent application Ser. No. 13/346,102, filed Jan. 9, 2012 for a "Heat Assisted Magnetic Recording System", which is incorporated herein for all purposes. The write channel 802 provides encoded write data 830 and the laser trigger pulse signal 832 to a write driver 834 with a unipolar laser driver in preamplifier 808. In some embodiments, the preamplifier 808 is mounted on an actuator arm 836, and the encoded write data 830 and laser trigger pulse signal 832 are driven from the channel circuit 806 by transmitters and delivered over a flex-cable in differential positive emitter-coupled logic (PECL) format to the write and laser driver 833 in the arm-mounted preamplifier 808. The preamplifier 808 converts the encoded write data 830 to an analog signal, generates a laser pulse control signal using a unipolar laser driver based on the laser trigger pulse signal 832, and impresses in the read/write head assembly 820 a bipolar programmable write current 838 of polarity determined by that of the PECL input 832. Simultaneously, laser trigger pulse signal input 832 causes generation of a laser pulse control signal in a unipolar laser driver such as that disclosed in FIGS. 1-6, which is impressed in read/write head assembly 820 on line 840.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Motor controller 812 and its associated actuator and spindle motor operate identically in write operations. A read circuit 842 in the preamplifier 808 establishes a bias current in the magneto-resistive read/write head assembly 820. Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal 844 representative of the magnetic data on disk platter 816. This minute analog signal 842 is transferred from read/write head assembly 820 to read circuit 842 in the preamplifier 806, where it is amplified and is conveyed to a read channel 846 in the channel circuit 806 as analog read data 848. In turn, read channel 846 decodes and digitizes the received analog signal to recreate the user data originally written to disk platter 816, as well as to extract servo head-position information.

As part of processing the analog read data 848, read channel circuit 846 may perform one or more operations such as analog filtering, variable gain amplification, analog to digital conversion, equalization, timing recovery, data detection, decoding, deserialization, and servo demodulation to obtain the user data and servo information. The user data is provided by read channel 846 as digital read data 850 to the interface controller 804, where it is error-corrected, stripped of special formatting fields, and reassembled in buffer memory for transmission to a user device as digital data 822. The read channel 846 also provides the servo data 852 to the interface controller 804 for use in driving the hard disk controller 810 and motor controller 812. During both the read and write operations, microcode in the interface controller 804 controls spindle speed and regulates head position to maintain accurate track-following and to seek between tracks. Servo position information for these functions is demodulated by the read channel 846 from dedicated fields prerecorded on the disk platter 816 at intervals between data records.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

It should also be noted that various functions or blocks of storage system 800 may be implemented in either software or firmware, while other functions or blocks are implemented in hardware. The various blocks disclosed herein may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for unipolar laser drivers that may be used, for example, in heat assisted magnetic recording. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A current driver comprising:
   an upper output terminal and a lower output terminal;
   a plurality of current switches configured to selectively contribute electrical currents through the upper and lower output terminals;
   a control input for each of the plurality of current switches configured to control the electrical currents;
   a voltage supply configured to establish a voltage across the upper and lower output terminals; and
   wherein the current driver is referenced to a single power supply rail.

2. The current driver of claim 1, wherein the plurality of current switches are configured to produce a drive current for a laser diode connected across the upper output terminal and the lower output terminal in a heat assisted magnetic recording system.

3. The current driver of claim 2, wherein the driver current comprises an on state, an on state with positive pre-emphasis pulse, an off state, and an off state with negative pre-emphasis pulse.

4. The current driver of claim 3, wherein the off state is substantially at the lasing threshold of the laser diode.

5. The current driver of claim 2, wherein the electrical currents additively contribute to the drive current.

6. The current driver of claim 1, wherein the voltage established by the voltage supply is configured to substantially offset the on voltage of a laser diode connected across the upper output terminal and the lower output terminal.

7. The current driver of claim 1, further comprising a second voltage supply configured to establish a bias voltage on the upper output terminal and the lower output terminal.

8. The current driver of claim 1, wherein the plurality of current switches comprise N-type semiconductor devices and wherein the single power supply rail comprises a lower power supply rail.

9. The current driver of claim 8, wherein the upper output terminal comprises a common anode conductor configured to connect to anodes of a plurality of laser diodes.

10. The current driver of claim 1, wherein the plurality of current switches comprise P-type semiconductor devices and wherein the single power supply rail comprises an upper power supply rail.

11. The current driver of claim 10, wherein the lower output terminal comprises a common cathode conductor configured to connect to cathodes of a plurality of laser diodes.

12. The current driver of claim 1, wherein the current driver is configured to drive a laser diode in differential mode with another current driver of opposite polarity.

13. The current driver of claim 1, wherein the control inputs comprise an enable input for each of the plurality of current switches configured to turn current through a corresponding one of the plurality of current switches on and off.

14. The current driver of claim 1, wherein the control inputs comprise a current level input for each of the plurality of current switches configured to set current levels of the electrical currents.

15. The current driver of claim 14, wherein at least one of the plurality of current switches comprises a current mirror to control the current level input.

16. The current driver of claim 14, wherein at least one of the plurality of current switches comprises a digital to analog converter to control the current level input.

17. The current driver of claim 1, further comprising flexible conductors configured to conduct electrical current through the upper output terminal and the lower output terminal, and a termination resistor configured to match an impedance of the flexible conductors.

18. The current driver of claim 1, wherein the current driver is incorporated in a storage device.

19. A method for generating multiple current levels with a unipolar current driver, comprising:
   selectably generating a first current with a first current switch, a second current with a second current switch, a third current with a third current switch, and a fourth current with a fourth current switch, wherein the first, second, third and fourth current switches are referenced to a single power supply rail;
   adding the first current and the second current to yield an off state current level at a current output, adding the first current, the second current, the third current and the fourth current to yield an on with pre-emphasis state current level at the current output, adding the first current, the second current, and the third current to yield an on state current level at the current output, and selecting the first current to yield an off with pre-emphasis state current level at the current output; and wherein the on with pre-emphasis state current level is greater than the on state current level which is greater than the off state current level which is greater than the off with pre-emphasis state current level.

20. A storage system comprising:

a storage medium maintaining a data set;

a magnetic write head configured to record data to a magnetic storage medium under control of a magnetic write data signal representative of the data set;

a laser diode configured to heat the magnetic storage medium under control of a laser pulse control signal; and a laser current driver configured to produce a drive current for the laser diode, the laser current driver comprising:
an upper output terminal and a lower output terminal;
a plurality of current switches configured to selectively contribute electrical currents to the drive current;
a control input for each of the plurality of current switches configured to control the electrical currents;
a voltage supply configured to establish a voltage across the laser diode; and
wherein the laser current driver is referenced to a single power supply rail.

* * * * *